Figure 1:
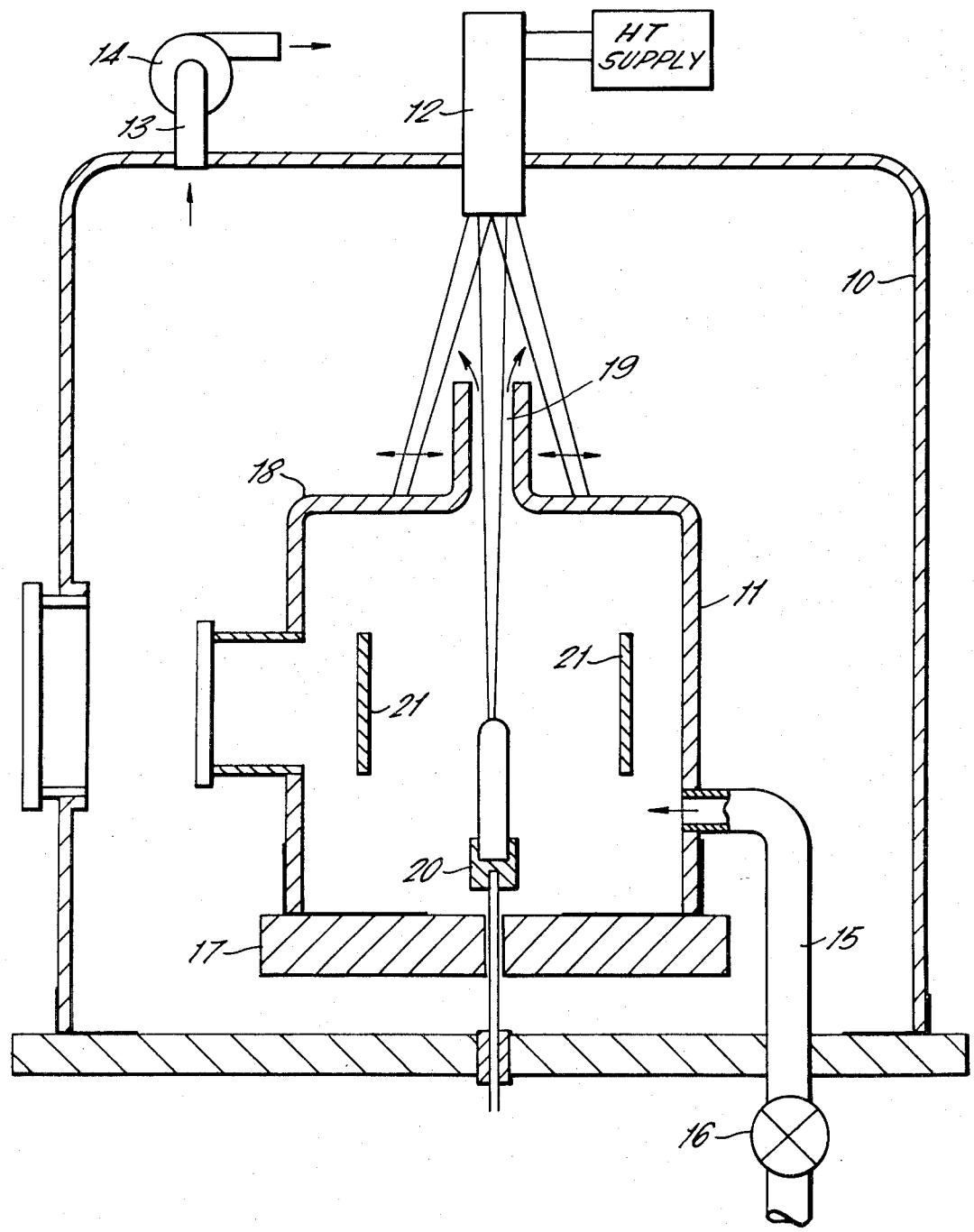

United States Patent [19]

Dugdale

[11] 4,224,897
[45] Sep. 30, 1980

[54] METHODS OF DEPOSITING MATERIALS ON SUBSTRATES

[75] Inventor: Ronald A. Dugdale, Didoot, England

[73] Assignee: United Kingdom Atomic Energy Authority, London, England

[21] Appl. No.: 943,349

[22] Filed: Sep. 18, 1978

Related U.S. Application Data

[63] Continuation of Ser. No. 540,391, Jan. 13, 1975, abandoned.

[30] Foreign Application Priority Data

Jan. 24, 1974 [GB] United Kingdom ................. 3315/74

[51] Int. Cl.³ ............................................. C23C 11/00
[52] U.S. Cl. .................................. 118/719; 118/50.1; 118/715; 204/298; 219/121 EB
[58] Field of Search ..................... 118/49.1, 49.5, 715, 118/719, 50.1; 427/38–42, 248 R, 219, 204; 219/121 EB; 204/298

[56] References Cited

U.S. PATENT DOCUMENTS

| 2,948,635 | 8/1960 | Koller . | |
| 3,528,387 | 9/1970 | Hamilton | 118/49.1 |
| 3,984,581 | 10/1976 | Dobbler et al. | 427/42 |
| 4,038,171 | 7/1977 | Moss et al. | 204/298 |
| 4,041,353 | 1/1979 | Penfold et al. | 204/298 |

Primary Examiner—Ronald H. Smith
Assistant Examiner—Janyce A. Bell
Attorney, Agent, or Firm—Larson, Taylor and Hinds

[57] ABSTRACT

A vapor deposition process which is carried out in a gaseous environment. The homogeneous nucleation of the vapor species in the gaseous environment is suppressed by heating the gaseous environment.

5 Claims, 2 Drawing Figures

METHODS OF DEPOSITING MATERIALS ON SUBSTRATES

This is a continuation of application Ser. No. 540,391 filed Jan. 13, 1975, now abandoned.

This invention relates to methods of depositing materials on to substrates using vapour deposition processes.

There is a variety of vapour deposition processes for depositing thin films or thicker coatings of one or more materials on to various hot or cold substrates. These processes range from chemical vapour deposition at relatively high gas pressure and temperature to physical vapour deposition, based on thermal evaporation in a high vacuum. In recent years interest has grown in a number of intermediate processes in soft vacuum, for example $10^{-3}$ to 1 torr, which may be physical and, or, chemical in nature. Gas discharges are sometimes employed to influence both the physical and chemical aspects of the process, for example, to generate vapour by sputtering, to cause chemical reaction among vapour species, or to encourage bonding to the substrate. The various processes overlap to some extent and it is generally felt that a number of factors and mechanisms influence the character of the deposit and the understanding of the importance and relevance of some aspects of these processes is often vague. In this context it has been found that with present known methods of vapour deposition, materials deposited on substrates in gaseous environments are nearly always friable, porous, or powdery columnar structures, the exact nature of which depends on the material, evaporation rate, ambient gas pressure, geometry of the apparatus, and the temperature of the substrate. To a certain extent the deposited material can be annealed by reheating it once it is deposited to provide a better coating.

Further experiments suggest that the transport of the vapour through the gas strongly influences the nature of the deposited material.

A likely explanation is that under conditions employed, homogeneous nucleation of particles of the material to be deposited tends to occur in the vapour phase. It is believed that the deposition of these particles gives the deposited material its characteristic porous, friable and columnar structure.

Homogeneous nucleation occurs readily at high concentrations of vapour species within an ambient gas and, indeed, is exploited for the manufacture of powders (for example, carbon-black and pigments). It can also readily occur in soft vacuum, for example, $10^{-3}$ to 1 torr, and particularly fine powders can be made this way. However, its occurence under vapour deposition conditions is in most cases undesirable.

In one aspect of the present invention there is provided a vapour deposition process in which a material is evaporated in gaseous environment and deposits on a substrate, wherein the gaseous environment is heated to suppress homogeneous nucleation of particles of the material in the gaseous environment.

The gaseous environment may be an inert gas which will not react chemically with the vapour of the material. Alternatively, the gaseous environment may react chemically with at least an element of the vapour to form a compound, in which case, the compound is deposited on the substrate.

The gaseous environment may be an ionisable gas maintained at a pressure at which a glow discharge may be generated in the gaseous environment, and a glow discharge may be generated in the gas.

The glow discharge process may be one in which the material constitutes a cathode in a glow discharge device and the vapour is produced by sputtering the cathode with ions derived from the glow discharge.

The glow discharge process may be one in which a beam of charged particles (electron or ion) is generated in the gaseous environment and the beam is directed at the material either to heat the material to vaporize it or to sputter atoms from the material, or to heat the substrate.

The glow discharge process may be one in which the gas is ionised by a radio frequency powered coil.

In a further aspect of the invention there is provided apparatus in which a material is evaporated in a gaseous environment and deposits on a substrate, comprising means for heating the gaseous environment through which the vapour passes thereby to suppress homogeneous nucleation of particles of the material in the gaseous environment.

In a further aspect of the invention there is provided apparatus for depositing material on a substrate by a vapour deposition process comprising, means for evaporating the material, an enclosure for containing a gaseous environment through which the vapour of the material passes to deposit on the substrate, and heating means for heating the gaseous environment to suppress homogeneous nucleation of particles of the material in the gaseous environment.

The gaseous environment may be an ionisable gas maintained at a pressure that will enable a glow discharge to be generated in the gas, and means may be provided for generating a glow discharge in the gas.

Preferably, the means for generating the glow discharge includes a cathode so shaped, and positioned in the enclosure that in use a beam of charged particles is directed at the material and/or the substrate.

In yet a further aspect of the invention there is provided a glow discharge device for depositing a material on a substrate by a vapour deposition process comprising, an enclosure for containing an ionisable gaseous environment at a predetermined pressure, an anode and a cathode, at least part of which is made of the material to be deposited on the substrate, located in the enclosure, means for applying an electrical potential to the anode and cathode in order to ionise gas in the enclosure and generate a glow discharge in which positive ions in the gas bombard the cathode, the cathode in operation being so positioned relative to the substrate that the sputtered material passes through the gas and deposites on the substrate, and heating means for heating the gas through which the sputtered atoms pass to suppress homogeneous nucleation of the sputtered atoms in the gas.

It is preferable that the substrate is positioned in the negative glow region of the glow discharge and not in the cathode-fall region.

The cathode may be a hollow right-circular cylinder, at least the inner surface of which is made of the material to be deposited. In this case, the substrate is located in the bore of the cylinder. The cathode may be made of layers of different materials so that layers of the materials may be deposited on the substrate.

Preferably the gaseous environment is constrained in a first enclosure which is heated. The first enclosure is located inside a second enclosure and the interiors of the first and second enclosures are inter-connected. A gas inlet means for admitting a gas to the interiors of the first and second enclosures may be provided in the first enclosure. A gas outlet through which the gas may be pumped from the first and second enclosures may be provided in the wall of the second enclosure.

The first enclosure may be heated by directing a beam of charged particles (i.e. electrons or ions) at a wall or walls of the first enclosure. It is preferred to use the same beam of charged particles that is used to vaporise the material to be deposited to heat the walls of the first enclosure. This may be achieved by directing the beam at the material to be vaporised through an opening in the wall of the first enclosure and then deflecting the beam so that it impinges on the wall of the chamber adjacent the opening. Alternatively, the first enclosure may be heated by means of an electrical resistance heater in contact with the wall of the first enclosure.

Figure 2:
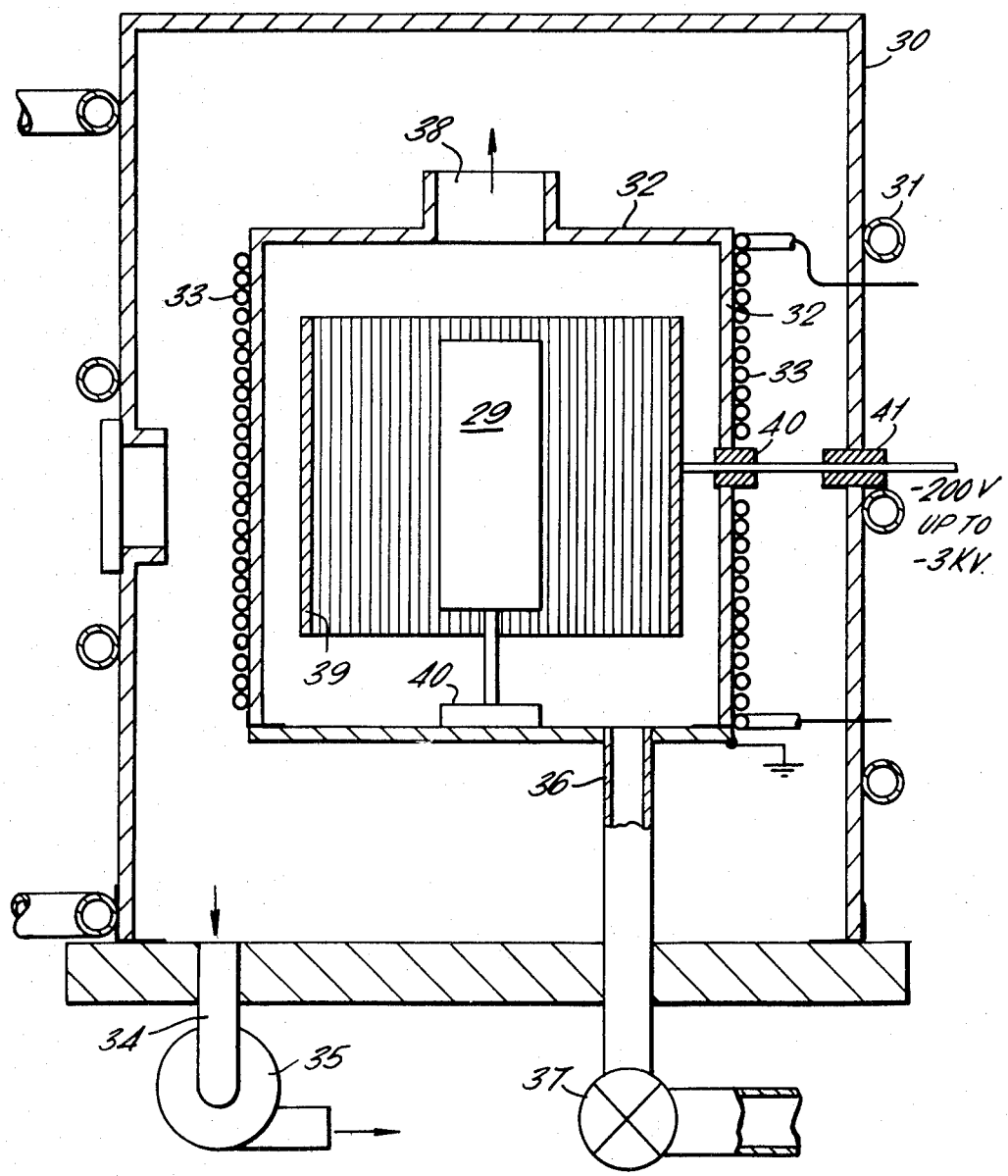

A number of devices will now be described, by way of examples only, with reference to the accompanying drawings, in which:

FIGS. 1 and 2 illustrate two forms of device constructed in accordance with the present invention.

Referring to FIG. 1 there is shown a device constructed in accordance with the present invention comprising an outer enclosure 10 in which is located a second enclosure 11. The enclosure 11 is thermally insulated from the enclosure 10.

The enclosure 10 is gas tight except for a gas outlet port 13 to which is connected a vacuum pump 14 and an inlet port 15 which is provided for the enclosure 11. The inlet port 15 to the enclosure 11 is connected to a source of gas and an electromagnetic valve 16 is provided in the inlet pipe. The pressure in the enclosures 10 and 11 is controlled by adjusting the flow of gas through the enclosures 10 and 11.

The enclosure 11 comprises a base 17, a cover 18 and a sealing gasket which is located between the base and the cover. The cover 18 has an opening 19 which is provided to enable an electron beam derived from an electron beam gun 12 mounted in the wall of the enclosure 10 to be directed into the enclosure 11. The electron beam gun 12 may be of any well-known design capable of producing a beam which can be directed into the enclosure 11 through the opening 19. A crucible is positioned in the enclosure 11 in the path of the electron beam from the gun 12 for holding the material to be evaporated and a substrate or receiving surface 21 to be coated with material is positioned near the source of material.

In operation, gas such as for example hydrogen, nitrogen, oxygen, air, helium, or argon is admitted to the enclosure 11 by opening the valve 16 and the vacuum pump 14 is started to suck out the gas in the enclosures 10 and 11. The walls of the enclosure 11 are heated by deflecting and scanning the electron beam from the gun 12 so that the electron beam is directed at at least part of the walls of the enclosure 11. The heat so generated is transferred by conduction to the remainder of the walls of the enclosure 11 and this in turn heats the gas within enclosure 11. The gas is heated to a temperature typically in the range of 200° to 600° C. or more. This also serves to cause out-gassing of the walls of the enclosure 11 and the components within the enclosure 11.

When the gas is heated to the desired temperature the electron beam is then deflected to heat the source material in the crucible 20 to vaporise it. The vapour is then caused to condense on the substrate 21. The substrate 21 may if desired be cooled to assist the condensation of the vapour on it. During the evaporation stage, the electron beam may be deflected periodically to reheat the enclosure 11.

The electron gun 12 may be a glow discharge type in which the gas used to generate the glow discharge is taken from the enclosure 11 or alternatively the gun may have its own gas supply. Furthermore, the electron gun 12 may be thermionic gun which employs high vacuum and the gun 12 may then be provided with its own vacuum system.

If desired, the electron beam gun need not be mounted in the wall of the enclosure 10 but instead the enclosure 10 may be provided with an electron permeable gas-tight window aligned with the opening 19 in the enclosure 11 so that an electron beam may be directed from a source located outside the enclosure 10.

In a modification of the device shown in FIG. 1, instead of using an electron beam to vaporise the source material in the crucible 20, the source material and, or, the enclosure 11 may be heated thermally by electrical resistance heaters, induction heaters or RF heaters, or like heaters, or by means of an external arc heater or laser.

Referring to FIG. 2 there is shown a further form of device for coating objects such as for example turbine blades 29 with various materials in accordance with the present invention. The device comprises an outer enclosure 30 around which is wound cooling ducts 31 through which a coolant is flowed. Located inside the enclosure 30 is a second enclosure 32 which is thermally insulated from the enclosure 30. The enclosure 32 is made of thermally conductive material and is constructed in such a manner that it can be heated, for example by electrical resistance heaters 33 placed against the outer surface thereof or by means such as inductance heaters or RF heaters. The outer enclosure 30 is gas tight except for the provision of a gas outlet port 34 to which is connected a vacuum pump 35. The inner enclosure 32 is provided with a gas inlet port 36 which is connected to a source of gas. An electromagnetic valve 37 is provided in the inlet pipe to control the flow of gas into the enclosure 32. The enclosure 32 is provided with a gas outlet port 38 which allows the gas that flows into chamber 32 to flow out into the chamber 30.

The pressure within the enclosures 30 and 32 is controlled by regulating the differential pumping between the gas coming in the inlet port 36 and the gas being pumped out of outlet port 34.

Located within the enclosure 32 is a hollow cylindrical cathode 39 which is mounted in insulators 40 and 41 in the walls of the enclosures 32 and 30. At least the inner circumferential surface of the cathode 39 is made of the material to be deposited on the turbine blades 29 or carries thin strips of the material, or elements of the material, which is to be deposited on the turbine blades 29. The cathode 39 may be made of layers of different materials so that layers of these materials would be deposited on the substrate as each layer is sputtered away from the cathode 39.

In operation of the device of FIG. 2 gas such as for example hydrogen, argon or helium or any other inert gas is admitted to the interior of the enclosure 32 by opening the valve 37 and the vacuum pump 35 is started to pump out gas from the interior of the enclosures 30 and 32. The pumping rates are controlled so as to maintain a pressure within the enclosure 32 in the range of $10^{-3}$ to 1 torr. The enclosure 32 is then heated so as to heat the gas within the enclosure 32 to a temperature within the range of 200° to 600° C. or more (950° C.).

When the gas within the enclosure is heated to the desired temperature and out-gassing of the components within the chamber 30 is complete, the enclosure 32 is electrically earthed and a negative potential with respect to the potential of enclosure 32 is applied to the cathode 39. The voltage of the cathode 39 is typically −200 volts up to −2 Kv with respect to the chamber 32.

The actual level of voltage applied to the cathode 39 is dependent upon the geometry and size of the chamber 32 and the cathode 39, the pressure of the gas, the type of gas, and the material from which the cathode is made. The voltage is however sufficient to ionize the gas within the enclosure 32 so as to generate a glow discharge in which positive ions within the gas bombard the cathode 39 and sputter material from the cathode. The sputtered material is caused to collect on the turbine blades 29 and condense there. The secondary electron emission of the cathode 39 may be used to heat the turbine blades 29 to a temperature in the range of 900° C. to further improve the coating of the material which deposits on the turbine blades 29.

It is preferable to ensure that the minimum distance between the object to be coated and the surface of the cathode 39 is such that the object is placed in the negative glow region of the glow discharge and not within the cathode fall region.

The cathode may be of any desired shape, for example it may be in the form of a sphere truncated at both ends instead of being cylindrical.

Furthermore, an earthed screen may be positioned adjacent those areas of the cathode from which the electron emission is not required. From the above it will be seen that by heating the gas within the inner enclosures 11 and 32 homogeneous nucleation and precipitation of particles of the material to be deposited in the gas is avoided.

The invention does not impede the heterogeneous nucleation of the vapour species at the surface of the substrate.

The glow discharge process of the present invention may be carried out in a reducing atmosphere.

Furthermore, the outgassing of the enclosure may be carried out in a reducing gas and the reducing gas may be purged and replaced with an inert or chemically reactive gas in which the glow discharge vapour deposition is carried out.

The crystal structure of the deposit may be controlled by regulating the substrate temperature during deposition.

The gaseous environment through which the vapour passes may be chemically inert or chemically reactive towards the vapour. In the latter case the gaseous environment may react with at least an element of the vapour so that a compound is formed and the compound is deposited on the substrate. I claim:

1. A vapor deposition apparatus for evaporating a material in a gaseous environment and depositing the evaporated material on a substrate, the apparatus comprising,
    (a) an outer enclosure;
    (b) an outer enclosure located within the outer enclosure, the outer enclosure and the inner enclosure each maintaining a gaseous environment therein;
    (c) an inlet for a gas into the inner enclosure;
    (d) a gas outlet from the inner enclosure to discharge into the outer enclosure;
    (e) a gas outlet from the outer enclosure;
    (f) means for supporting a material to be vaporized in the inner enclosure; and
    (g) means outside the inner enclosure for generating a beam of charged particles and for selectively directing the beam through the inner enclosure at the material supporting means so as to vaporize the material supported thereby, and periodically directing the beam at the outside of a wall of the inner enclosure so as to heat said wall to a temperature such that, in use of the apparatus, the gas in the inner enclosure, at least in the region between the material to be vaporized and a substrate to be coated with the material, is heated by said heated wall to a temperature high enough to suppress homogeneous nucleation of particles of the vaporized material in the gas in said region.

2. Apparatus according to claim 1 wherein the gas is an ionizable gas maintained at a pressure that will enable a glow discharge to be generated in the gas, and means are provided for generating a glow discharge in the gas comprising an anode, a cathode located in the enclosure, and a power supply means for applying an electrical potential to the anode and cathode in order to ionize the gas, at least part of the cathode being made of the material to be deposited and constituting the source of the material to be deposited.

3. Apparatus according to claim 2 wherein the cathode is shaped and positioned relative to the anode and the substrate so as to direct secondary electrons emitted by the cathode at the substrate thereby to heat it.

4. Apparatus according to claim 2 wherein the cathode is a hollow circular cylinder at least the inner surface of which is made of the material to be deposited and the substrate is located concentrically in the bore of the cathode.

5. Apparatus according to claim 2 wherein the cathode is made of layers of different materials.

* * * * *